United States Patent
Agrawal et al.

(10) Patent No.: US 6,233,197 B1
(45) Date of Patent: May 15, 2001

(54) MULTI-PORT SEMICONDUCTOR MEMORY AND COMPILER HAVING CAPACITANCE COMPENSATION

(75) Inventors: Ghasi R. Agrawal, San Jose; Thomas R. Wik, Livermore, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/524,734

(22) Filed: Mar. 14, 2000

(51) Int. Cl.[7] ........................................... G11C 8/00

(52) U.S. Cl. ........................ 365/230.05; 365/69; 365/156

(58) Field of Search ..................... 365/230.05, 230.06, 365/156, 190, 189.02, 230.08, 69

(56) References Cited

U.S. PATENT DOCUMENTS 5,828,623 * 8/1998 Dilbeck .......................... 365/230.05
5,886,919 * 3/1999 Morikawa et al. .................... 365/69

* cited by examiner

Primary Examiner—David Nelms
Assistant Examiner—David Lam

(57) ABSTRACT

A multi-port semiconductor memory includes first and second data ports and a plurality of memory cells arranged in rows and columns. Each column comprises first and second pairs of complementary bit lines, which are coupled to each of the memory cells in that column. The first pair of bit lines cross one another between every N and N+1 of the memory cells the column, where $N=2^M$ and M is an integer variable greater than zero. A data inversion circuit is coupled between the first pair of bit lines and the first data port, which selectively inverts the first pair of bit lines as a function of the first port's (M+1)th row address input bit only, as measured from the least significant row address input bit.

11 Claims, 4 Drawing Sheets

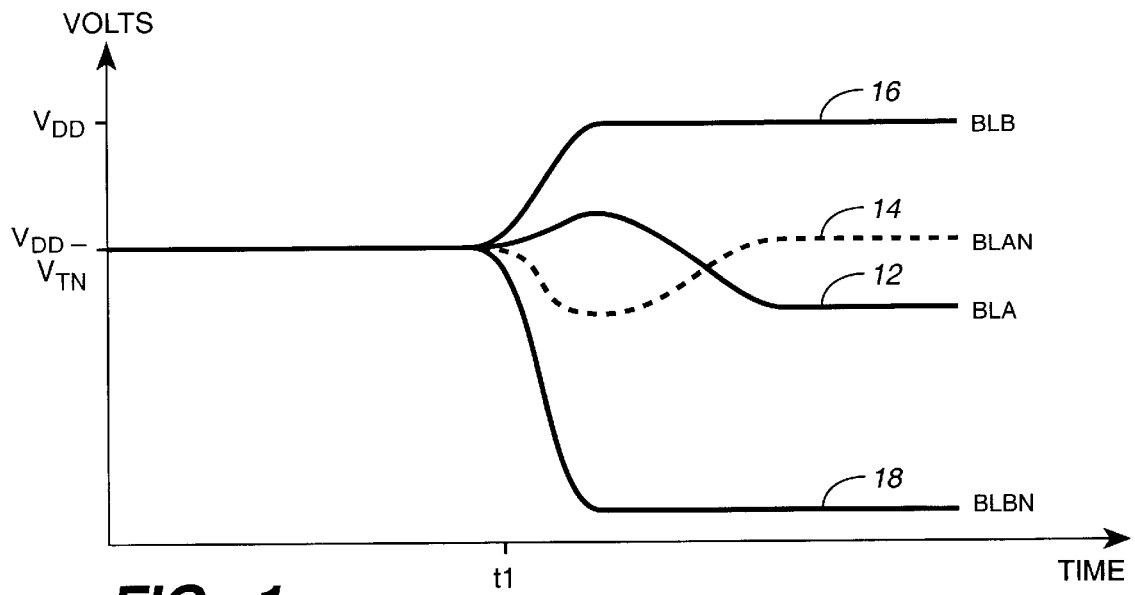
FIG._1
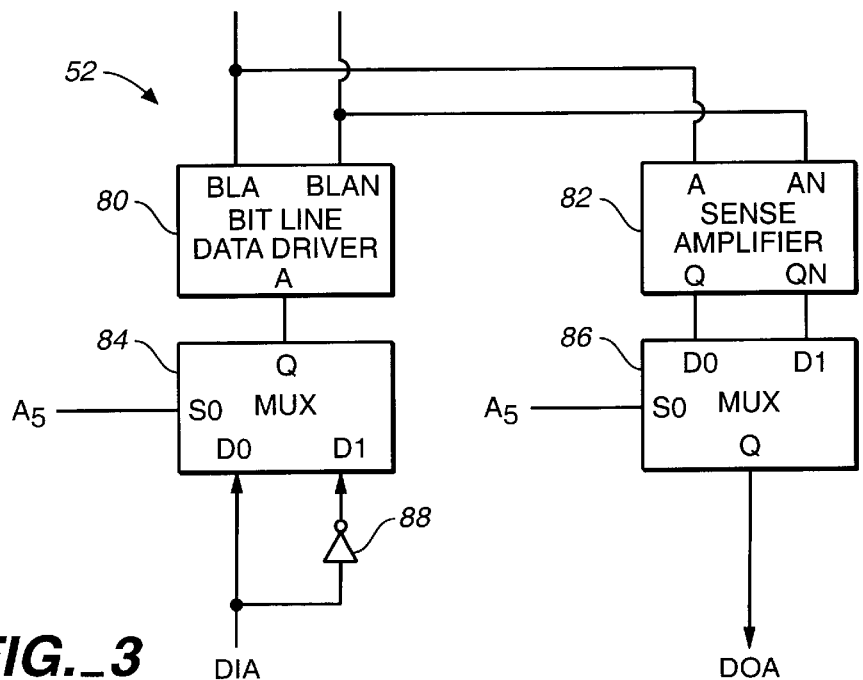
FIG._3

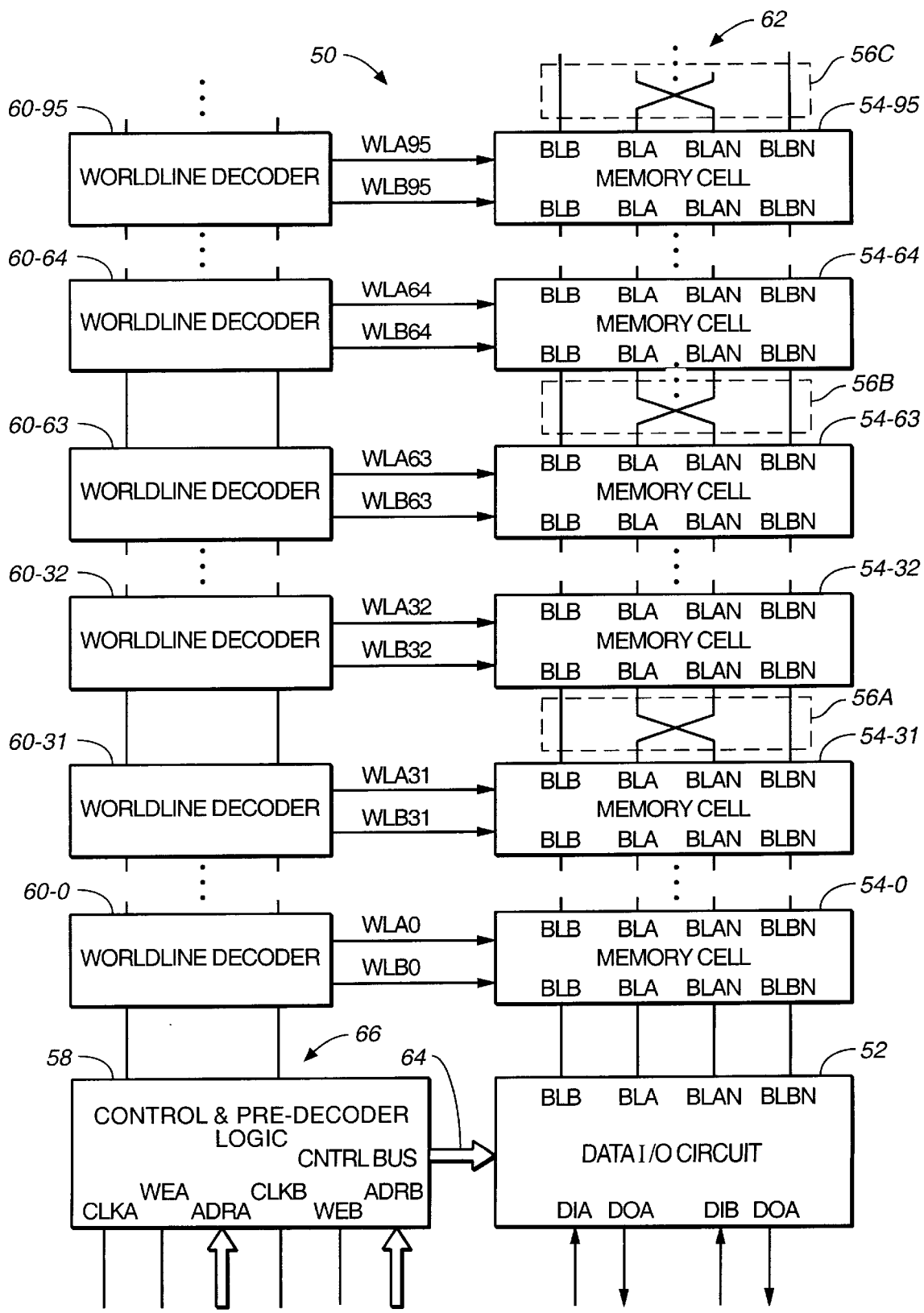
FIG._2

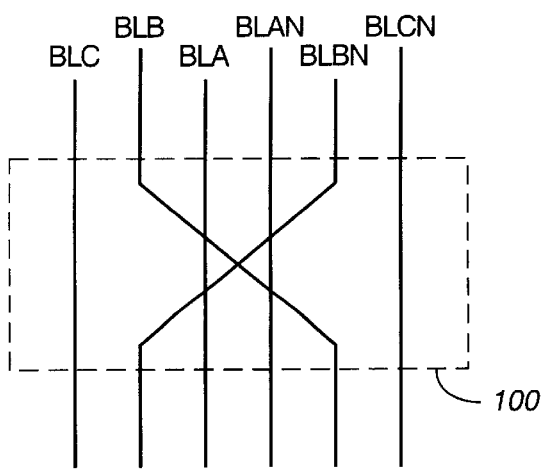
FIG._4A
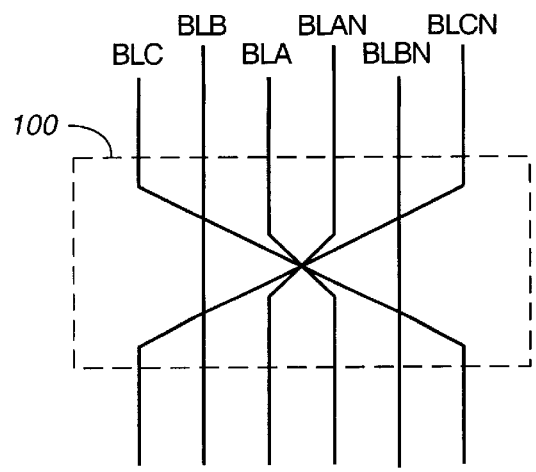
FIG._4B
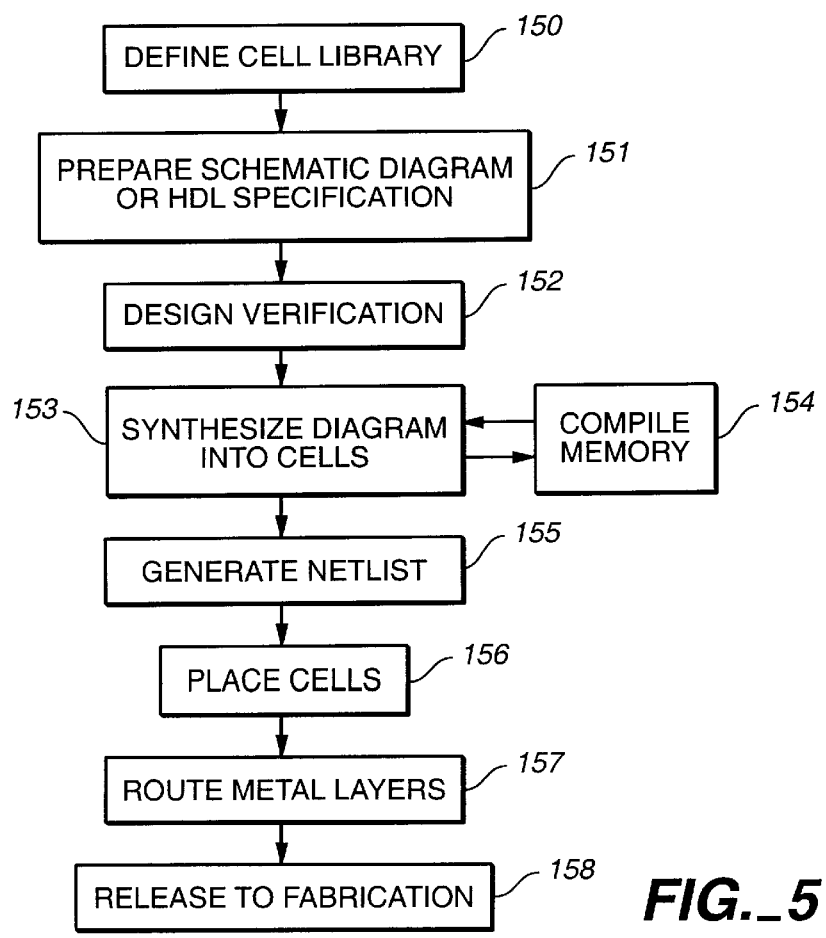
FIG._5

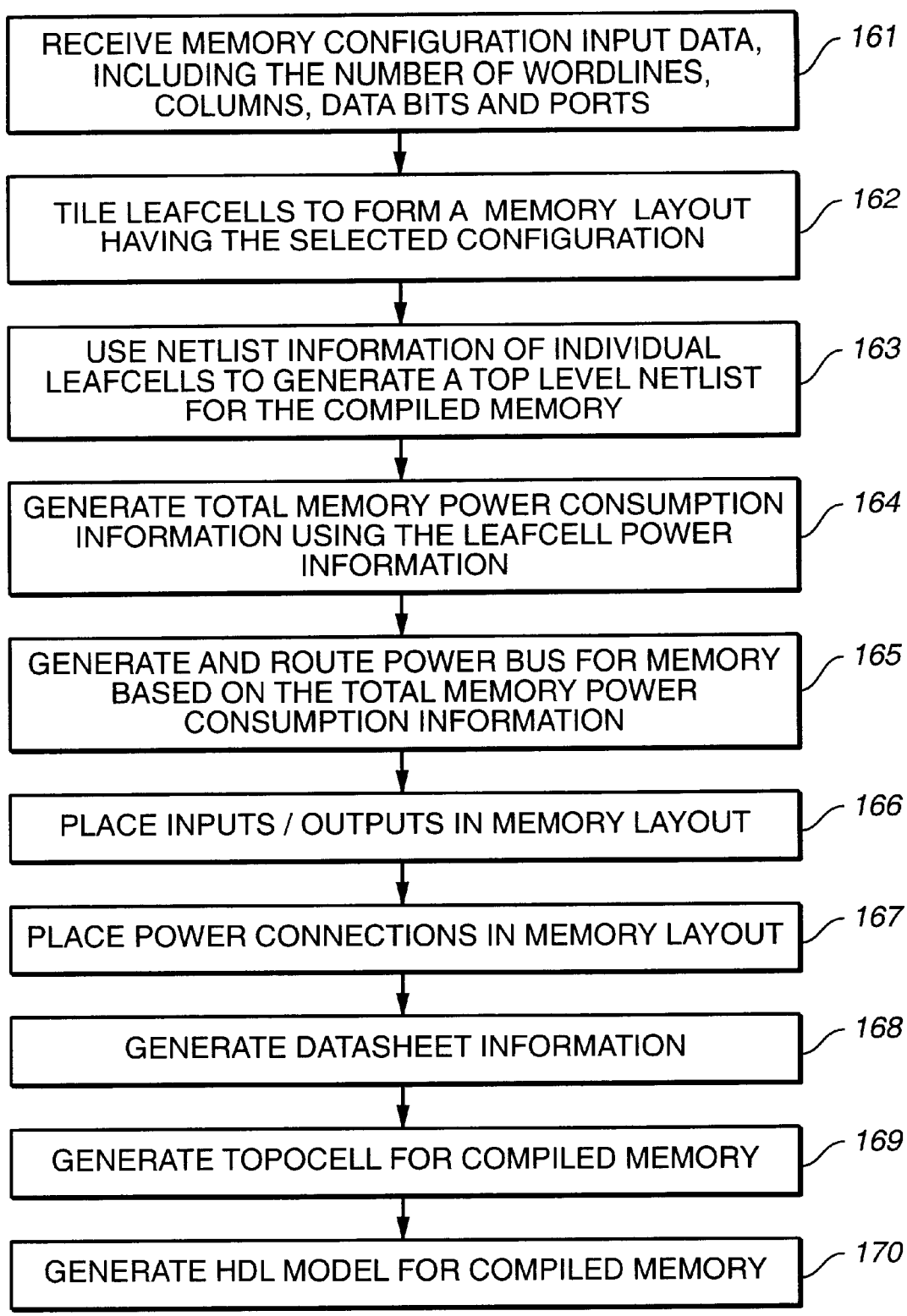
FIG._6

MULTI-PORT SEMICONDUCTOR MEMORY AND COMPILER HAVING CAPACITANCE COMPENSATION

BACKGROUND OF THE INVENTION

The present invention relates to semiconductor memories and memory compilers. In particular, the present invention relates to a memory and memory compiler in which selected bit line pairs are crossed at multiple locations to compensate for coupling capacitance with adjacent bit lines.

In high density semiconductor memories, coupling capacitance between adjacent bit lines in the memory can corrupt the data that is written to or read from the memory. Two methods of avoiding the effects of coupling capacitance include providing extra spacing between the bit lines and shielding one bit line from the next bit line with power and ground conductors during layout of the memory. However, these methods are costly in terms of silicon area for high density memories. Moreover, even with proper spacing, it is often difficult to completely eliminate capacitive coupling.

U.S. Pat. No. 5,140,556 to Cho et al. discloses a single-port dynamic random access memory (DRAM) circuit having dummy cells, which are connected to twisted bit lines. The memory is divided into four equal segments, and the bit lines of adjacent memory cells are twisted between the segments to compensate for capacitive coupling. However, this patent does not address avoidance of coupling capacitance between bit lines of two or more ports, which are part of the same memory cell, in a multi-port memory. In addition, while this implementation can be used with custom memory devices, it is difficult, if not impossible, to implement this method in a memory compiler for embedded memory devices in which the number of rows in the memory is variable.

A method of compensating for coupling capacitance between bit lines of different ports of the same memory cell has been used by LSI Logic Corporation in their embedded memory cores. With multi-port memories, capacitive coupling can occur between the bit lines of different ports during simultaneous access (writing or reading) of different cells of the same column of the memory. With an LSI dual-port memory core, the internal bit lines (BLA and BLAN) of one of the two ports were switched (i.e. crossed) at the middle of each column of the memory. By crossing the internal bit lines of one port at the middle of the memory, the effects of capacitive coupling along the upper half of the memory is cancelled out by the capacitive coupling along the lower half of the memory.

Since the bit lines of one port were switched in the middle of the memory for one port, the data inputs and data outputs of that port were inverted when writing to or reading from the upper half of the memory, which saw an inversion in the crossed bit lines at the middle of the memory. This ensured that the same data could be written to and read from the upper half of the memory through the port with switched bit lines and through the port without switched bit lines.

Unfortunately, the above method of compensating for coupling capacitance has some inherent difficulties. In memory compiler applications, where the number of rows in the memory is variable, it is very difficult for the compiler algorithm to locate the bit line crossing location exactly in the middle of each column. Also, the row address bits, which identify whether the upper or lower half of the memory is being accessed, had to be decoded to determine whether the data inputs or data outputs had to be inverted for the port having the switched bit lines. This decoding can be very tedious and can become very difficult to implement in a memory compiler environment where the number of physical rows can vary.

To optimize the address decoding logic, the memory compiler algorithm is written to find a tolerance capacitance below which coupling between adjacent bit lines has no significant effect. This tolerance capacitance is then correlated to a maximum number of physical rows along which there is no compensation. The total memory array is then divided into two parts such that the maximum difference between the two parts is less than or equal to the tolerance size. Keeping this criterion in mind, the algorithm chooses a switch point to optimize the address decoding.

Although this algorithm reduces complexity of the address decoding somewhat, it is difficult for the memory compiler algorithm to find a good and reliable tolerance capacitance since the tolerance capacitance can vary significantly with process variation, amount of circuit noise and power bumps. The chances of silicon failure using the above-technique can be very high in some applications.

Improved structures and methods of compensating for coupling capacitance between adjacent bit lines in large multi-port memories are desired.

SUMMARY OF THE INVENTION

One aspect of the present invention is directed to a multi-port semiconductor memory, which includes first and second data ports and a plurality of memory cells arranged in rows and columns. Each column comprises first and second pairs of complementary bit lines, which are coupled to each of the memory cells in that column. The first pair of bit lines cross one another between every N and N+1 of the memory cells the column, where $N=2^M$ and M is an integer variable greater than zero. The memory further includes a plurality of row address input bits for each of the first and second ports, which have a least significant row address bit and which address the plurality of memory cells. A data inversion circuit is coupled between the first pair of bit lines and the first data port, which selectively inverts the first pair of bit lines as a function of the first port's (M+1)th row address input bit only, as measured from the least significant row address input bit.

Another aspect of the present invention is directed to a multi-port semiconductor memory, which includes first and second data ports and a plurality of memory core cells arranged in a plurality of rows and a plurality of columns. Each of the columns includes first and second pairs of complementary bit lines, which are coupled to the memory cells that are located in that column. A wordline decoder circuit addresses the plurality of memory core cells and has a plurality of row address input bits, including a least significant row address bit, for each of the first and second data ports. The memory further includes a circuit for crossing the first pair of bit lines between every N and N+1 of the memory core cells in each of the columns, where $N=2^M$ and M is an integer variable greater than zero. A data inversion circuit selectively inverts the first pair of bit lines between each column and the first data port as a function of only the (M+1)th row address bit for the first port, as measured from the least significant row address bit.

Yet another aspect of the present invention is directed to a computer readable medium, which includes a semiconductor memory compiler. The memory compiler has instructions which, when executed by a computer cause the computer to perform steps of: tiling a plurality of memory core cells in a plurality of rows and columns to form a memory layout pattern having first and second data ports, wherein each of the columns comprises first and second pairs of complementary bit lines, which are coupled to the memory cells that are located in that column; placing a wordline decoder circuit within the memory layout pattern, which comprises a plurality of row address input bits, including a least significant row address bit, for each of the first and second data ports, which address the plurality of memory cells; crossing the first pair of bit lines between every N and N+1 of the memory core cells in each of the columns, where N=$2^M$ and M is an integer variable greater than zero; and placing a selective data inversion circuit in the memory layout pattern between the first pair of bit lines and the first data port, for selectively inverting the first pair of bit lines as a function of only the (M+1)th row address bit for the first port, as measured from the least significant row address bit.

BRIEF DESCRIPTION OF THE DRAWINGS

FIG. 1 is a graph illustrating the effects of capacitive coupling between bit line pairs in a multi-port memory.

FIG. 2 is a schematic diagram of a multi-port semiconductor memory according to one embodiment of the present invention.

FIG. 3 is a simplified schematic diagram which illustrates selective data inversion performed by a data I/O circuit in the memory shown in FIG. 2.

FIGS. 4A and 4B are schematic illustrations illustrating alternative bit line switch cells for a three port memory.

FIG. 5 is a flow chart which illustrates a typical process of designing and fabricating a semiconductor integrated circuit according to one embodiment of the present invention.

FIG. 6 is a flow chart which illustrates the various steps performed by a memory compiler in the process shown in FIG. 5, according to one embodiment of the present invention.

DETAILED DESCRIPTION OF THE PREFERRED EMBODIMENTS

A multi-port memory has a plurality of memory cells arranged in columns and rows. Each column has a pair of complementary bit lines for each port, which are routed parallel to one another through the memory cells in that column. Each memory cell is enabled through appropriate address decode logic.

In large, multi-port semiconductor memories, there is coupling capacitance between the adjacent pairs of bit lines of different ports within each memory cell. In high density memories, this coupling capacitance can become large enough to affect the functionality of the memory.

FIG. 1 is a graph illustrating the capacitive coupling between pairs of bit lines for a memory having two ports, port A and port B, during simultaneous write and read operations. Lines 12 and 14 represent a pair of complementary bit lines BLA and BLAN for port A. Lines 16 and 18 represent a pair of complementary bit lines BLB and BLBN for port B.

Prior to a read or write operation, each bit line is precharged to a reference level, such as a gate-source threshold voltage VTN less than a supply voltage $V_{VDD}$. At time T1, a logic "one" is written to a particular memory cell through port B, with BLB line 16 going high and BLBN line 18 going low. Simultaneously, a read operation is performed, which reads a logic "zero" from another memory cell in the same column through port A. Because of capacitive coupling between BLB line 16 and BLA line 12 (and between BLBN line 18 and BLAN line 14) the port A bit lines BLA and BLAN initially go in the wrong direction and recover later on. The sense amplifiers coupled to bit lines BLA and BLAN therefore start reading the wrong data. Even though bit lines BLA and BLAN recover over time, the sense amplifier also takes some time to recover. This reduces the timing margin at the memory output latch and many times can cause the wrong data to be latched. In any case, this capacitive coupling causes an adverse increase in the access time specification for the memory.

FIG. 2 is a schematic diagram of a portion of a multi-port semiconductor memory 50 according to one specific embodiment of the present invention. Memory 50 compensates for the coupling capacitance between adjacent bit line pairs of different ports within each column of the memory.

Memory 50 is a dual-port memory, which includes ports A and B, data input/output circuit 52, memory core cell instances 54-0 to 54-95, switch cells 56A, 56B and 56C, control and pre-decoder logic 58 and wordline decoder instances 60-0 to 60-95. Memory cells 54-0 to 54-95 are aligned in a column 62, where each memory cell defines a corresponding row of memory 50. Although only one column is shown in FIG. 2, it should be understood that any number of columns can be used with the present invention. Also, memory 50 can have any number of rows and any number of ports.

Data bit lines BLA, BLAN, BLB and BLBN extend along column 62 and are coupled to each of the memory cells 54-0 to 54-95 in column 62 for providing data to and from each memory cell during read and write operations. Bit lines BLA and BLAN together form a pair of complementary bit lines for port A of memory 50, and bit lines BLB and BLBN form a pair of complementary bit lines for port B of memory 50. These bit lines are typically routed at the memory cell level, and connected to one another through abutment of adjacent memory cells. However, other methods of routing the bit lines can also be used.

Data I/O circuit 52 includes data input DIA and data output DOA for port A and data input DIB and data output DOB for port B. Data I/O circuit 52 has internal data drivers coupled to the bit lines for write operations and sense amplifiers coupled to the bit lines for read operations. Data input DIA is coupled to bit line pair BLA and BLAN through an internal data driver, and data output DOA is coupled to bit line pair BLA and BLAN through a sense amplifier. Similarly, data input DIB is coupled to bit line pair BLB and BLBN through a data driver, and data output DOB is coupled to bit line pair BLB and BLBN through a sense amplifier. Data I/O circuit 52 further includes column multiplexing circuitry (not shown) for selecting column 62 for ports A and B, as is well known in the art.

Control and pre-decoder logic 58 includes clock inputs CLKA and CLKB, write enable inputs WEA and WEB, and address inputs ADRA and ADRB, for ports A and B, respectively. In a typical memory, the least significant address bits are used as column address bits, and the most significant address bits are used as row address bits. The column address bits for ports A and B are pre-decoded to generate column select signals for ports A and B, which are provided to data I/O circuit 52 over control bus 64. These column select signals are used to select or de-select column 62 through the column multiplexing circuitry in data I/O circuit 52 during read and write operations.

Control bus 64 also includes read/write control signals, which are generated for each port based on write enable inputs WEA and WEB. In addition, Control and pre-decoder logic 58 supplies one of the row address bits to data I/O circuit 52 over bus 64 for controlling the selective data inversion for the port having switched bit lines, as described in more detail below.

Control and pre-decoder logic 58 predecodes the row address bits into a plurality of predecoded row address signals 66, which are applied to each of the wordline decoders 60-0 to 60-95. Wordline decoders 60-0 to 60-95 further decode the pre-decoded row address signals 66 into individual wordlines WLA0-WLA95 and WLB0-WLB95 for each port. Wordlines WLA0-WLA95 and WLB0-WLB95 are used to enable memory cells 54-0 to 54-95 for ports A and B, respectively, as is known in the art. There is one wordline output per port for each row of memory 50.

Since memory 50 has two ports, it is possible for a write operation and a read operation (or two read operations) to be performed simultaneously on different memory cells within the same column of memory 50. This can cause capacitive coupling between adjacent bit lines of different ports as discussed with reference to FIG. 1. In order to reduce the effects of capacitive coupling, bit lines BLA and BLAN for port A are switched (crossed over one another) at multiple locations within column 62. In the specific embodiment shown in FIG. 2, bit lines BLA and BLAN are switched after every 32 rows in memory 50.

For example, bit lines BLA and BLAN are switched between memory cells 54-31 and 54-32 at switch cell 56A. Switch cell 56A couples bit line BLA of memory cell 54-31 to the complementary bit line BLAN of memory cell 54-32 and couples bit line BLAN of memory cell 54-31 to the complementary bit line BLA of memory cell 54-32. In effect, this inverts the relative polarity of bit lines BLA and BLAN for memory cells 54-32 through 54-63 as compared to the relative polarity of bit lines BLA and BLAN for memory cells 54-0 through 54-31. Similarly, switch cell 56B inverts the polarity of bit lines BLA and BLAN between memory cell 54-63 and memory cell 20 54-64. This pattern repeats for the entire column 62.

The switching of bit lines BLA and BLAN can be accomplished through a separate semiconductor cell that is placed between respective memory cells or can be accomplished within the memory cells themselves without adding to the area consumed by memory 50. For example, when the bit lines of one port are to be switched at a particular location, special memory cell instances can be placed adjacent to the location, which have been designed through internal routing to switch the bit lines.

When bit lines BLA and BLAN are switched after every 32 rows, the coupling capacitance between bit lines BLA and BLB along one set of 32 rows gets compensated by the coupling capacitance between bit lines BLA and BLBN along the next set of 32 rows. Similarly, the coupling capacitance between bit lines BLAN and BLBN along one set of 32 rows gets compensated by the coupling capacitance between bit lines BLAN and BLB along the next set of 32 rows. With the embodiments shown in FIG. 2, there can be a maximum of 32 uncompensated rows. This residual coupling capacitance would be negligible for most applications.

Although the embodiment shown in FIG. 2 has the bit lines switched after every 32 rows, in alternative embodiments the bit lines can be switched after any number of N rows (i.e. between every N and N+1 memory cell), where N, where $N=2^M$ and M is an integer variable greater than zero. Also, bit lines BLB and BLBN can be switched instead of bit lines BLA and BLAN. With multiple switching of bit lines, there will be at most N uncompensated rows in the memory. The value of N can therefore be selected to achieve a desired capacitive coupling tolerance for a particular application.

Some of the memory cells, such as cells 5432 to 54-63, see an odd number of inversions through bit lines BLA and BLAN from data I/O circuit 52 to the memory cells and some of the memory cells, such as 54-0 to 54-31 and 54-64 to 54-95, see an even number of inversions or no inversions. In order to ensure that a given data bit that is written (or read) through port A has the same polarity as it would if it were read (or written) through port B (which has no inversions), data I/O circuit 52 selectively inverts the data inputs and outputs of port A based on the row address of port A.

Since the bit lines are switched after every N rows, if there are "P" row address bits, $A_P \ldots A_0$, with $A_0$ being the least significant row address bit, then the logic state of the (M+1)th row address bit, $A_M$, as measured from the least significant row address bit for the corresponding port can be used to determine whether the data inputs and outputs should be inverted. This allows the use of only a single row address bit to control the selective data inversion in data I/O circuit 52. This row address bit is supplied by logic 58 over control bus 64. In the example shown in FIG. 2, N=32. Therefore, the sixth row address bit, $A_5$, is used to control the inversion.

When the sixth row address bit is a logic "zero", data I/O circuit 52 performs no data inversion since the addressed memory cell sees no inversions or sees an even number of inversions in bit lines BLA and BLAN. When the sixth row address bit is a "one", data I/O circuit 52 inverts the data inputs and outputs of port A since the addressed memory cell sees an odd number of inversions in bit lines BLA and BLAN.

During a write operation, when data is written through port A to any of the memory cells that see no inversions or an even number of inversions in bit lines BLA and BLAN, data I/O circuit 52 does not invert the data going from data input DIA to the corresponding bit line data driver. When data is written through port A to any of the memory cells that see an odd number of inversions in bit lines BLA and BLAN, data I/O circuit 52 inverts the data going from data input DIA to the corresponding bit line data driver. Therefore, non-inverted data is always written to the addressed memory cell. This data can then be read accurately in a non-inverted form through port B.

During a read operation, when data is read through port A from any of the memory cells that see no inversions or an even number of inversions, data I/O circuit 52 does not invert the data going from the corresponding sense amplifier to data output DOA. When data is read through port A from any of the memory cells that see an odd number of inversions, data I/O circuit 52 inverts the data going from the corresponding sense amplifier to data output DOA.

FIG. 3 is a simplified schematic diagram which illustrates a selective data inversion circuit that can be implemented within data I/O circuit 52 to selectively invert the data inputs and outputs, according to one embodiment of the present invention. Data I/O circuit 52 includes, among other elements and control logic not shown, bit line data driver 80, sense amplifier 82, multiplexers 84 and 86 and inverter 88. Data input DIA is coupled to data input D0 of multiplexer 84 and to the input of inverter 88. The output of inverter 88 is coupled to data input D1 of multiplexer 84. Row address bit A5 is applied to select input "S0" of multiplexer 84.

Output Q of multiplexer 84 is coupled to input "A" of bit line data driver 80. Driver 80 drives complementary bit lines BLA and BLAN as a function of the data applied to input "A" of the driver. Multiplexer 84 selectively inverts the data applied to input A by multiplexing inputs "D0" and "D1" of multiplexer 84 as a function of the logic state of row address bit A5. When row address bit A5 is a logic "zero", multiplexer 84 passes non-inverted data input "D0" to multiplexer output "Q" for driving bit lines BLA and BLAN. When row address bit A5 is a logic "1", multiplexer 84 passes the inverted data input "D1" to multiplexer output "Q" for driving bit lines BLA and BLAN.

Similarly, multiplexer 86 selectively inverts the outputs of sense amplifier 82 as a function of the logic state of row address bit A5. Sense amplifier 82 has differential sense inputs "A" and "AN", which are coupled to bit lines BLA and BLAN, respectively. Alternatively, a single-ended sense amplifier can be used. Complementary sense amplifier outputs "Q" and "QN" are coupled to data inputs "D0" and "D1" of multiplexer 86. When row address bit A5 is a "zero", multiplexer 86 passes multiplexer input "D0", which is received from non-inverted sense amplifier output "Q", to port A data output DOA through multiplexer output "Q". When row address bit A5 is a "one" multiplexer 86 passes multiplexer input "D1", which is received from inverted sense amplifier output "QN", to port A output DOA.

The particular data inversion circuitry shown in FIG. 3 is provided as an example only. Numerous other inversion circuits or methods of inverting the data selectively as a function of one of a row address bit can be used with the present invention.

As mentioned above, the present invention can be applied to a memory having any number of multiple ports. FIGS. 4A and 4B illustrate examples of switch cells for memories having three data ports. In FIG. 4A, there are three pairs of complementary bit lines, BLA,BLAN, BLB,BLBN and BLC,BLCN. There is one bit line pair for each of the three data ports. To compensate for capacitive coupling between the bit lines of one port and adjacent bit lines of another port, switch cell 100 can be placed along the bit lines, between every N and N+1 memory cell in the column. Switch cell 100 crosses the bit lines in bit line pair BLB,BLBN so that their relative polarity inverts at the location of the switch cell. This compensates for capacitive coupling between bit line BLB and bit lines BLA and BLC and between bit line BLBN and bit lines BLAN and BLCN. Alternatively, switch cell 100 can cross the bit lines of bit line pairs BLA,BLAN and BLC,BLNC as shown in FIG. 4B. Corresponding data inversion circuits would then be placed in data I/O circuit 52 for selectively inverting the data inputs and outputs that are coupled to the crossed bit lines.

The use of multiple switching of bit lines to compensate for capacitive coupling between the bit lines of different ports of the same memory cell and the use of a single row address bit to control the selective data inversion allows this method of compensation to be implemented easily in a memory compiler application, where the number of rows in the memory is variable. A memory compiler is formed of a software program and an accompanying database that are typically provided by a semiconductor manufacturer to its customer for assisting the customer in integrating memories into the customer's logic designs. For example, the semiconductor manufacturer may provide the memory compiler with a semiconductor cell library containing an embedded memory cell for an application specific integrated circuit (ASIC).

FIG. 5 is a flow chart, which illustrates a typical process of designing and fabricating a semiconductor integrated circuit according to one embodiment of the present invention. Semiconductor integrated circuits are designed and fabricated by first selecting or defining a cell library, at step 150. The cell library is typically defined by the manufacturer of the integrated circuit.

Next, the logic designer prepares a schematic diagram or hardware description language (HDL) specification of a logical circuit, at step 151, in which instances of the cells in the cell library are selected and interconnected to form a desired logical function. For example, the logic designer may select the embedded memory cell and define its configuration, such as the number of rows (i.e., wordlines), the number of columns, the number of ports and the number of data bits per port. The schematic diagram or HDL specification is then passed to a computer-aided design verification tool, which assists the logic designer in verifying the desired logical function, at step 152. The design verification performed at step 152 often leads to changes in the schematic diagram or HDL specification prepared at step 151.

Once the schematic diagram or HDL specification is complete, it is passed to a series of additional computer-aided design tools, beginning at step 153, which assist the logic designer in converting the schematic diagram or HDL specification to a semiconductor integrated circuit layout definition that can be fabricated. At step 153, the schematic diagram or HDL specification is synthesized into the cells of the cell library defined in step 150. If the schematic diagram or HDL specification includes a memory, the memory is compiled by the memory compiler, at step 154, as part of the synthesizing process.

The memory compiler generates a "topocell", a memory datasheet and an HDL model for the memory. The topocell contains various information about the memory, such as rules regarding the routing of signals over the memory, output connection information and power connection information. This information is used in later chip-level placement and routing fabrication steps. The memory database includes timing, power and other relevant information about the physical operation of the compiled memory, which the logic designer uses in the chip-level design process. The HDL model can include a Verilog model, a VHDL model or an IKOS model, for example, which is used in chip-level logical simulations. The steps performed by the memory compiler are described in more detail below with reference to FIG. 5.

At step 155, the design tools generate a netlist of the selected cells and the interconnections between the cells. At step 156, the cell instances are "placed" to form a layout pattern for the integrated circuit by arranging the cells in selected locations. The cell instances can be placed manually or by an automatic placement tool. Once all of the cell instances have been placed, the logic designer continues the design process by routing electrical interconnections between the placed cell instances along routing paths within the various metal routing layers, at step 157. If there are no further design changes to the schematic diagram or HDL specification, then the layout pattern, the corresponding cell definitions and the routing data can be released to fabrication, at step 158.

FIG. 6 is a flow chart which illustrates the operation of the memory compiler in greater detail. The memory compiler includes two major components, a software program and a database, which defines a library of "leafcells". These components are typically stored on a computer readable medium, such as a floppy disc, a hard disc, a magnetic tape or a random access memory, for example, which an be accessed by the computer-aided design tools. The software program includes a plurality of instructions which, when executed by a computer, cause the computer to perform the steps shown in FIG. 5.

The leafcells define the various component parts of the memory and have predefined inputs and outputs. Examples of leafcells include a memory core cell, a wordline decoder cell, a column multiplexer cell, a sense amplifier cell, a data driver cell, control cells and a data inversion cell, for example. Each leafcell in the library has a variety of components. These components include a layout of the transistors and other elements contained within the leafcell, a netlist of the electrical interconnections between the transistors and other elements within the leafcell, and the physical size of the leafcell. The library of leafcells also includes a table of timing information, a table of power consumption information, and an HDL model template for various configurations of the compiled memory.

During operation, the memory compiler's software instructions perform steps 161–170 in FIG. 5. At step 161, the memory compiler receives memory the configuration input data, such as the number of wordlines, columns, ports and data bits per port. Based on the configuration input data, the memory compiler "tiles" individual instances of the leafcells, at step 162, to form a memory layout having the selected configuration. Electrical connections between the leafcells are accomplished through abutment of adjacent leafcells, for example. Alternatively, a routing step can be performed to route the interconnections.

In addition, the memory compiler crosses the chosen pair (or pairs) of bit lines so that their relatively polarity inverts between every N and N+1 of the memory core cells in each column, where $N=2^M$ and M is an integer variable greater than zero. The value of M can be fixed in the compiler or provided as one of the configuration data inputs. The memory compiler crosses the bit lines by placing switch cells at the appropriate locations or by placing specially designed memory core cells adjacent the crossing locations. The specially designed memory core cells can be designed to automatically cross the selected bit lines when abutted to an adjacent memory core cell in the same column without adding any extra real estate to the cell. The memory compiler also places data inversion cells at the appropriate ports and routes the appropriate (M+1)th row address bit to the data inversion cells so that when these cells are tiled, the row address bit controls the inversion of data inputs and outputs.

Once the leafcells have been tiled to form a memory layout, at step 162, the memory compiler uses the netlist information of the tiled leafcells to generate a top level netlist for the compiled memory, at step 163. This netlist includes a list of the inputs and outputs of each leafcell instance and the electrical interconnections between these inputs and outputs. The top level netlist can be used by later design verification tools to run "layout versus schematic" (LVS) checks and layout design rule checks (DRC), for example.

At step 164, the memory compiler generates power consumption information for the entire memory using the power consumption information of each leafcell instance. At step 165, the memory compiler generates a power bus and places the power bus around the compiled memory within the memory layout pattern, based on the total power consumption information generated in step 164.

At step 166, the memory compiler defines input and output connection information for the compiled memory within the memory layout pattern, such as the address, data and write/read control inputs for each port. This connection information is used later on when the compiled memory is placed at the chip level. At step 167, the memory compiler defines power connection information for the compiled memory, which is used to supply power to the memory at the chip level.

At step 168, the memory compiler generates data sheet information for the compiled memory. The data sheet information includes timing, power and other relevant information about the compiled memory, which the customer can use during the design process at the chip level. At step 169, the memory compiler generates a topocell for the compiled memory. As discussed above, the topocell includes information about input and output connections, power connections and rules regarding conductor routing in various metal layers over the memory. The topocell is used by the chip level placement and routing tools. At step 170, the memory compiler generates the HDL model for the compiled memory. This model can then be used during chip level design verification simulations.

As can be seen from the flow chart of FIG. 5, the method of compensating for capacitive coupling of the present invention can be implemented easily and reliably in a memory compiler application. Since only one row address bit is used to decode the selective data inversions, this address bit can be quickly identified and routed to the appropriate data inversion cells without any complex calculations or decoding circuitry. Also, since the bit line switch locations are placed at predefined, regular intervals (i.e. after every N rows, where $N=2^M$ and M is an integer variable greater than 1), these locations can also be identified quickly and reliably, regardless of the particular memory configuration.

Although the present invention has been described with reference to preferred embodiments, workers skilled in the art will recognize that changes may be made in form and detail without departing from the spirit and scope of the invention. For example, various circuit configurations can be used to switch or cross bit lines and selectively invert the data inputs and outputs. The present invention can be implemented in a variety of multi-port memory types, such as an SRAM. Also, the terms "row" and "column" used in the specification and the claims are interchangeable. Similarly, the term "coupled" can include a variety of connections, such as a direct connection or a connection through one or more intermediate elements.

What is claimed is:

1. A multi-port semiconductor memory comprising:
    first and second data ports;
    a plurality of memory cells arranged in rows and columns, wherein each of the columns comprises first and second pairs of complementary bit lines, which are coupled to each of the memory cells that are in that column, and wherein the first pair of bit lines cross one another between every N and N+1 of the memory cells that are in that column, where $N=2^M$ and M is an integer variable greater than zero;
    a plurality of row address input bits for each of the first and second ports, which include a least significant row address, bit and address the plurality of memory cells; and
    a data inversion circuit coupled between the first pair of bit lines and the first data port, which selectively inverts the first pair of bit lines as a function of the first port's (M+1)th row address input bit only, as measured from the least significant row address input bit.

2. The multi-port semiconductor memory of claim 1 wherein the first pair of bit lines is positioned between and electrically isolated from the second pair of bit lines in each column.

3. The multi-port semiconductor memory of claim 2 wherein the second pair of bit lines has a relative polarity that is maintained without inversion as the second pair of bit lines extend through each column of the memory cells.

4. The multi-port semiconductor memory of claim 1 wherein where N and M have values such that the first pair of bit lines cross one another at multiple locations within each column.

5. The multi-port semiconductor memory of claim 1 wherein the memory is a static random access (SRAM) memory.

6. The multi-port semiconductor memory of claim 1 wherein N=32 and M=5, such that the first pair of bit lines cross one another after every 32 rows of the memory cells in each column and the data inversion circuit is adapted to invert the relative polarity of the first pair of bit lines as a function of a logic state of the 6th row address bit.

7. The multi-port semiconductor memory of claim 1 and further comprising:
   a third data port;
   a third pair of complementary bit lines within each of the columns, which is coupled to the third data port and to each of the memory cells that are in each column; and
   wherein the second pair of bit lines is positioned between the first pair of bit lines, which is positioned between the third pair of bit lines and wherein the second and third pairs of bit lines each have a relative polarity within the pair that is maintained without inversion as the second and third pairs of bit lines extend through that column of the memory cells.

8. The multi-port semiconductor memory of claim 1 and further comprising:
   a third data port;
   a plurality of address bits for the third port, which address the plurality of memory cells;
   a third pair of complementary bit lines within each of the columns, which is coupled to each of the memory cells that are in that column, wherein the first pair of bit lines is positioned between the second pair of bit lines, which is positioned between the third pair of bit lines, and wherein the third pair of bit lines cross one another between every N and N+1 of the memory cells in that column;
   wherein the data inversion circuit is further coupled between the third pair of bit lines and the third data port and is adapted to selectively invert the third pair of bit lines as a function of the (M+1)th row address bit only for the third port; and
   wherein the second pair of bit lines has a relative polarity that is maintained without inversion as the second pair of bit lines extends through that column of the memory cells.

9. A multi-port semiconductor memory comprising: first and second data ports;
   a plurality of memory core cells arranged in a plurality of rows and a plurality of columns, wherein each of the columns comprises first and second pairs of complementary bit lines, which are coupled to the memory cells that are located in that column;
   a wordline decoder circuit, which comprises a plurality of row address input bits, including a least significant row address bit, for each of the first and second data ports and which address the plurality of memory core cells;
   means for crossing the first pair of bit lines between every N and N+1 of the memory core cells in each of the columns, where $N=2^M$ and M is an integer variable greater than zero; and
   means for selectively inverting the first pair of bit lines between each column and the first data port as a function of only the (M+1)th row address bit for the first port, as measured from the least significant row address bit.

10. A computer readable medium comprising a semiconductor memory compiler, the memory compiler comprising instructions which, when executed by a computer cause the computer to perform steps of:
    tiling a plurality of memory core cells in a plurality of rows and columns to form a memory layout pattern having first and second data ports, wherein the number of rows and columns is variable and each of the columns comprises first and second pairs of complementary bit lines, which are coupled to the memory cells that are located in that column;
    placing a wordline decoder circuit within the memory layout pattern, which comprises a plurality of row address input bits, including a least significant row address bit, for each of the first and second data ports, which address the plurality of memory cells;
    crossing the first pair of bit lines between every N and N+1 of the memory core cells in each of the columns, where $N=2^M$ and M is an integer variable greater than zero; and
    placing a selective data inversion circuit in the memory layout pattern between the first pair of bit lines and the first data port, for selectively inverting the first pair of bit lines as a function of only the (M+1)th row address bit for the first port, as measured from the least significant row address bit.

11. The computer readable medium of claim 10 wherein the memory compiler comprises instructions which, when executed by a computer further cause the computer to perform step of:
    receiving memory configuration data, including a wordline input variable, which defines a number of the memory core cells that are tiled in each of the plurality of columns.

* * * * *